United States Patent
Kimura et al.

(10) Patent No.: US 12,348,212 B2
(45) Date of Patent: Jul. 1, 2025

(54) ELASTIC WAVE DEVICE AND LADDER FILTER

(71) Applicant: Murata Manufacturing Co., Ltd., Nagaokakyo (JP)

(72) Inventors: Tetsuya Kimura, Nagaokakyo (JP); Naohiro Nodake, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/975,928

(22) Filed: Oct. 28, 2022

(65) Prior Publication Data

US 2023/0053722 A1     Feb. 23, 2023

Related U.S. Application Data

(63) Continuation of application No. PCT/US2021/029683, filed on Apr. 28, 2021.

(60) Provisional application No. 63/017,101, filed on Apr. 29, 2020.

(51) Int. Cl.
     *H03H 9/02*          (2006.01)
     *H03H 9/13*          (2006.01)
     *H03H 9/56*          (2006.01)

(52) U.S. Cl.
     CPC ........ *H03H 9/02133* (2013.01); *H03H 9/133* (2013.01); *H03H 9/568* (2013.01)

(58) Field of Classification Search
     CPC ............... H03H 9/02; H03H 9/13; H03H 9/54
     See application file for complete search history.

(56) References Cited

U.S. PATENT DOCUMENTS

| | | | |
|---|---|---|---|
| 8,123,966 B2 | 2/2012 | Kubo et al. | |
| 9,419,584 B2 | 8/2016 | Tsurunari et al. | |
| 9,780,759 B2* | 10/2017 | Kimura | H10N 30/85 |
| 10,389,332 B2* | 8/2019 | Bhattacharjee | H03H 9/02275 |
| 10,491,192 B1* | 11/2019 | Plesski | H03H 9/568 |
| 10,615,774 B2* | 4/2020 | Omura | H03H 3/08 |
| 11,177,787 B2* | 11/2021 | Caron | H03H 9/02228 |
| 11,509,281 B2* | 11/2022 | Omura | H03H 9/205 |

(Continued)

FOREIGN PATENT DOCUMENTS

| | | | | |
|---|---|---|---|---|
| JP | 2012-257019 A | 12/2012 | | |
| WO | WO-2012086441 A1 * | 6/2012 | ............ | H01L 41/18 |
| WO | WO-2019065666 A1 * | 4/2019 | ........... | H01L 41/047 |

OTHER PUBLICATIONS

Official Communication issued in International Patent Application No. PCT/US2021/029683, mailed on Aug. 5, 2021.

*Primary Examiner* — Andrea Lindgren Baltzell
*Assistant Examiner* — Alan Wong
(74) *Attorney, Agent, or Firm* — Keating & Bennett, LLP

(57) ABSTRACT

An elastic wave device includes a piezoelectric film made of lithium niobate or lithium tantalate, and a first electrode finger and a second electrode finger opposing each other in a direction intersecting a thickness direction of the piezoelectric film. When an average thickness of the piezoelectric film is d and a distance between centers of the first electrode finger and the second electrode finger is p, d/p is about 0.5 or less. The first electrode finger and the second electrode finger are connected to the first and second bus bars, respectively. The first and second bus bars include corner portions. At least one of corner portions of the first and second bus bars is outside a cavity portion when viewed in plan view.

19 Claims, 12 Drawing Sheets

(56) References Cited

U.S. PATENT DOCUMENTS

| | | | |
|---|---|---|---|
| 11,742,827 B2* | 8/2023 | Inoue | H03H 9/02559 |
| | | | 310/313 A |
| 2016/0204760 A1 | 7/2016 | KOn et al. | |
| 2017/0187352 A1* | 6/2017 | Omura | H03H 9/25 |
| 2017/0250671 A1 | 8/2017 | Omura et al. | |
| 2019/0222192 A1 | 7/2019 | Nakahashi | |
| 2022/0311417 A1* | 9/2022 | Yang | H03H 9/02228 |
| 2023/0049436 A1* | 2/2023 | Turner | H03H 9/13 |

* cited by examiner

ELASTIC WAVE DEVICE AND LADDER FILTER

CROSS REFERENCE TO RELATED APPLICATIONS

This application claims the benefit of priority to U.S. Patent Application No. 63/017,101 filed on Apr. 29, 2020, and is a Continuation Application of PCT Application No. PCT/US2021/029683, filed on Apr. 28, 2021. The entire contents of each application are hereby incorporated herein by reference.

BACKGROUND OF THE INVENTION

1. Field of the Invention

The present invention relates to an elastic wave device including a cavity portion below a piezoelectric film and a ladder filter including the elastic wave device.

2. Description of the Related Art

Conventionally, an elastic wave device in which a cavity portion is provided below a piezoelectric film is known. For example, Japanese Patent Application Laid-Open No. 2012-257019 discloses an elastic wave device using a Lamb wave as a plate wave. In this elastic wave device, a cavity portion is provided in a support substrate. A piezoelectric film overlaps the cavity portion. An IDT electrode is provided on an upper surface of the piezoelectric film. Reflectors are provided on both sides of the IDT electrode. Thus, an elastic wave resonator using a plate wave is constructed.

In the elastic wave device including the cavity portion as described in Japanese Patent Application Laid-Open No. 2012-257019, cracks may occur in the piezoelectric film.

SUMMARY OF THE INVENTION

Preferred embodiments of the present invention provide elastic wave devices each including a cavity portion each of which are able to reduce or prevent cracks in a piezoelectric film, and ladder filters each including such an elastic wave device.

According to a preferred embodiment of the present invention, an elastic wave device includes a support substrate including a first main surface and a recessed portion open to the first main surface, a piezoelectric film made of lithium niobate or lithium tantalate, laminated on the first main surface of the support substrate, and defining a cavity portion with the recessed portion and the support substrate, and an electrode on the piezoelectric film and including first and second bus bars, a first electrode finger connected to the first bus bar, and a second electrode finger connected to the second bus bar. The first and second bus bars include a plurality of corner portions when viewed in a plan view, the elastic wave device uses a bulk wave in a thickness slip mode, and at least one of the corner portions of the first and second bus bars is outside the cavity portion when viewed in the plan view.

According to a preferred embodiment of the present invention, an elastic wave device includes a support substrate including a first main surface and a recessed portion open to the first main surface, a piezoelectric film made of lithium niobate or lithium tantalate, laminated on the first main surface of the support substrate, and defining a cavity portion with the recessed portion and the support substrate, and an electrode on the piezoelectric film and including first and second bus bars, a first electrode finger connected to the first bus bar, and a second electrode finger connected to the second bus bar. The first and second bus bars include a plurality of corner portions when viewed in a plan view. When a thickness of the piezoelectric film is d and a distance between centers of the first electrode finger and second electrode finger is p, d/p is about 0.5 or less. At least one of the corner portions of the first and second bus bars is outside the cavity portion when viewed in the plan view.

According to a preferred embodiment of the present invention, an elastic wave device includes a support substrate including a first main surface and a recessed portion open to the first main surface, a piezoelectric film laminated on the first main surface of the support substrate and defining a cavity portion with the recessed portion and the support substrate, and an interdigital transducer (IDT) electrode on the piezoelectric film so that a portion of the IDT electrode overlaps the cavity portion. The IDT electrode includes first and second bus bars, a plurality of first electrode fingers connected to the first bus bar, and a plurality of second electrode fingers connected to the second bus bar. The plurality of first electrode fingers and the plurality of second electrode fingers are interleaved with each other. The first and second bus bars include a plurality of corner portions when viewed in a plan view. At least one of the corner portions of the first and second bus bars is outside the cavity portion when viewed in the plan view.

According to preferred embodiments of the present invention, it is possible to provide elastic wave devices which each include a cavity portion while also reducing or preventing cracks in the piezoelectric film, and ladder filters each including such an elastic wave device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by explaining preferred embodiments of the present invention with reference to the drawings.

Each of the preferred embodiments described herein is an example and partial substitutions or combinations of configurations are possible between different preferred embodiments.

First Preferred Embodiment

A first preferred embodiment of the present invention includes a piezoelectric film made of lithium niobate or lithium tantalate, and a first electrode finger and a second electrode finger. The piezoelectric film includes first and second main surfaces opposing each other, and the first electrode finger and the second electrode finger are provided on the first main surface.

In the first preferred embodiment, a bulk wave in a thickness slip mode is used. Further, in a second preferred embodiment of the present invention, when the average thickness of the piezoelectric film is d and the distance between centers of the first electrode finger and the second electrode finger is p, d/p is about 0.5 or less. Thus, in the first and second preferred embodiments, the Q value can be increased even when the size of the elastic wave device is reduced.

Figure 1A:
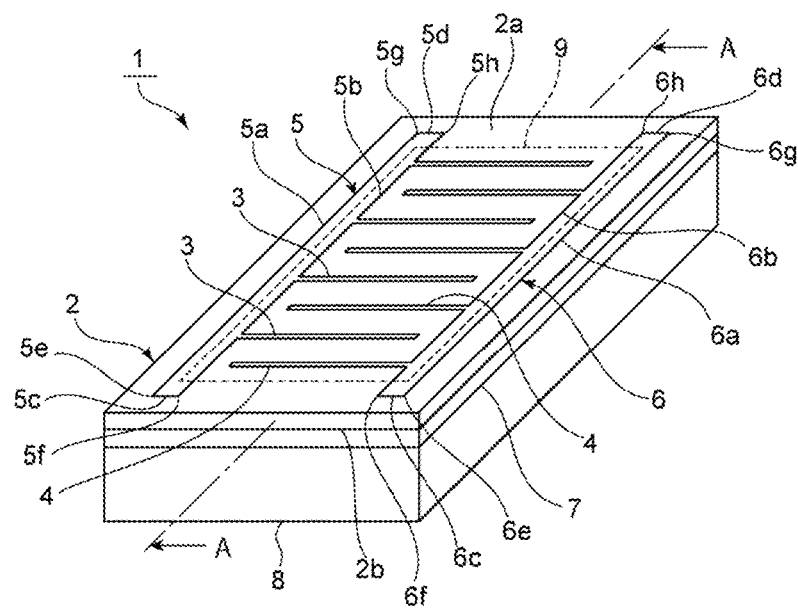
FIGS. 1A and 1B are a perspective view and a plan view explaining an elastic wave device according to a first preferred embodiment of the present invention.
Figure 1B:
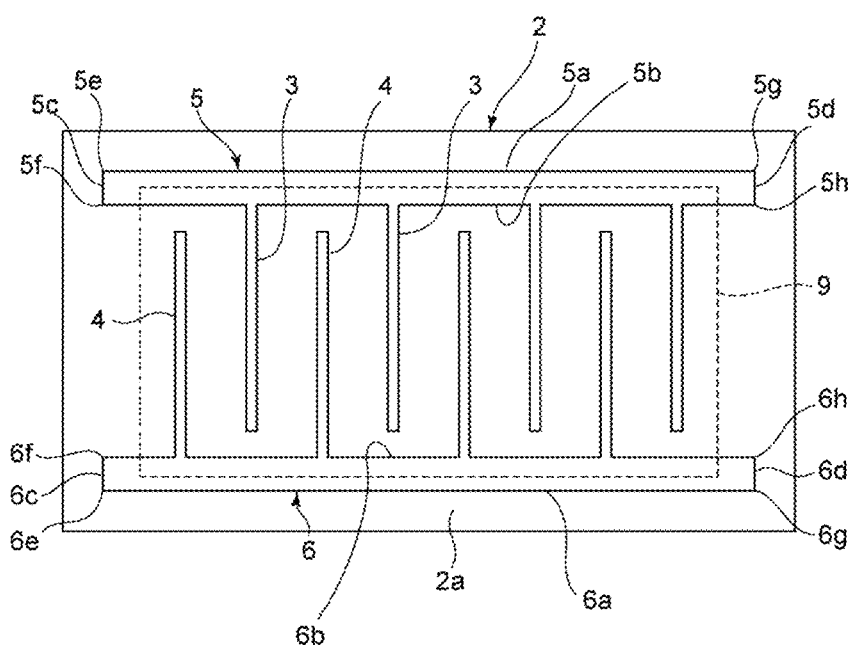
Figure 2:
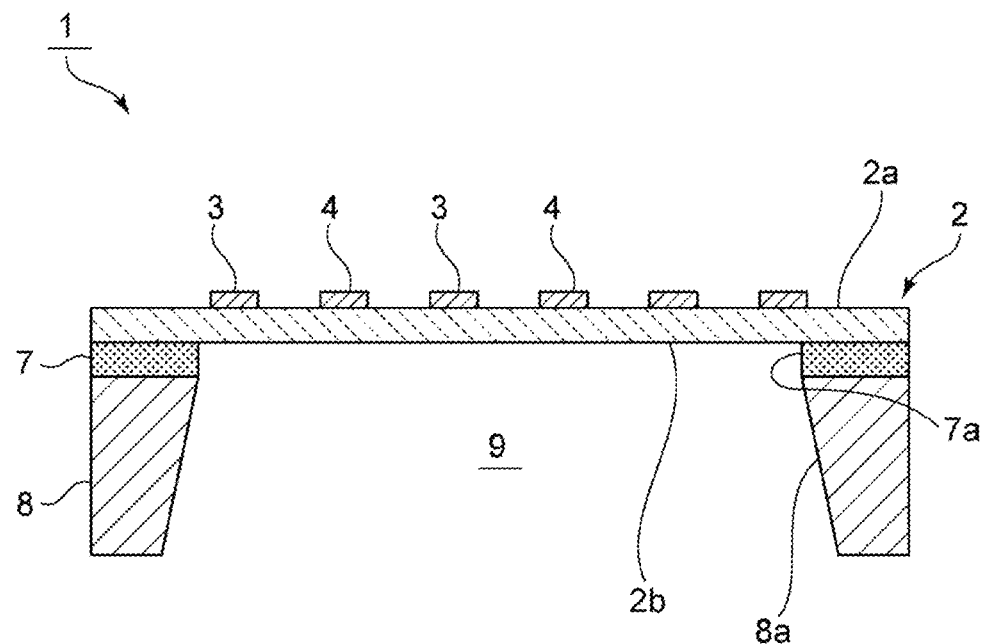
FIG. 2 is a sectional view showing a portion of the elastic wave device according to the first preferred embodiment of the present invention along the line A-A in FIG. 1A.

FIG. 1A is a perspective view explaining an elastic wave device according to a first preferred embodiment of the present invention, FIG. 1B is a plan view showing an electrode structure on a piezoelectric film, and FIG. 2 is a sectional view showing a portion along the line A-A in FIG. 1A.

An elastic wave device 1 includes a piezoelectric film 2 preferably made of $LiNbO_3$, for example. The piezoelectric film 2 may also be made of $LiTaO_3$, for example. The cut angle of $LiNbO_3$ or $LiTaO_3$ is Z-cut in the present preferred embodiment, but may be, for example, rotary Y-cut or X-cut. For example, a propagation direction of Y propagation and X propagation±about 30° is preferable. The thickness of the piezoelectric film 2 is not particularly limited, but is preferably about 50 nm or more and about 600 nm or less, for example, in order to effectively excite a thickness slip mode.

The piezoelectric film 2 includes first and second main surfaces 2a and 2b opposing each other. First electrode fingers 3 and second electrode fingers 4 are provided on the first main surface 2a. In FIGS. 1A and 1B, the plurality of first electrode fingers 3 are connected to a first bus bar 5. The plurality of second electrode fingers 4 are connected to a second bus bar 6. The plurality of first electrode fingers 3 and the plurality of second electrode fingers 4 are interleaved with each other. The first electrode fingers 3 and the second electrode fingers 4 have a rectangular or substantially rectangular shape and have a length direction. In a direction orthogonal or substantially orthogonal to the length direction, the first electrode fingers 3 and the adjacent second electrode fingers 4 oppose each other. Both of the length direction of the first and second electrode fingers 3 and 4 and the direction orthogonal or substantially orthogonal to the length direction of the first and second electrode fingers 3 and 4 are directions intersecting with the thickness direction of the piezoelectric film 2. Therefore, the first electrode fingers 3 and the adjacent second electrode fingers 4 oppose each other in the direction intersecting the thickness direction of the piezoelectric film 2. In addition, the length direction of the first and second electrode fingers 3 and 4 may be switched to the direction orthogonal or substantially orthogonal to the length direction of the first and second electrode fingers 3 and 4 shown in FIGS. 1A and 1B. That is, in FIGS. 1A and 1B, the first and second electrode fingers 3 and 4 may extend in the direction in which the first bus bar 5 and the second bus bar 6 extend.

In that case, the first bus bar 5 and the second bus bar 6 extend in the direction in which the first and second electrode fingers 3 and 4 extend in FIGS. 1A and 1B. A plurality of pairs in which the first electrode finger 3 connected to one potential and the second electrode finger 4 connected to the other potential are adjacent to each other are provided in the direction orthogonal or substantially orthogonal to the length direction of the first and second electrode fingers 3 and 4.

Here, the state in which the first electrode finger 3 and the second electrode finger 4 are adjacent to each other does not refer to a case where the first electrode finger 3 and the second electrode finger 4 are arranged to be in direct contact with each other, but to a case where the first electrode finger 3 and the second electrode finger 4 are spaced apart at an interval from one another. Further, when the first electrode finger 3 and the second electrode finger 4 are adjacent to each other, no electrodes connected to a hot electrode or a ground electrode including other first and second electrode fingers 3 and 4 are provided between the first electrode finger 3 and the second electrode finger 4. The number of pairs does not have to be an integer pair, but may be, for example, 1.5 pairs, 2.5 pairs, or the like.

The distance between centers of the first and second electrode fingers 3 and 4, that is, the pitch is preferably in the range of about 1 μm or more and about 10 μm or less, for example. The distance between the centers of the first and second electrode fingers 3 and 4 is a distance connecting the center of the width dimension of the first electrode finger 3 in the direction orthogonal or substantially orthogonal to the length direction of the first electrode finger 3 and the center of the width dimension of the second electrode finger 4 in the direction orthogonal or substantially orthogonal to the length direction of the second electrode finger 4.

Furthermore, in a case where a plurality of at least one of the first and second electrode fingers 3 and 4 are provided (when the first and second electrode fingers 3 and 4 are regarded as an electrode pair, 1.5 pairs or more of electrode pairs are provided), the distance between the centers of the first and second electrode fingers 3 and 4 refers to the average value of the respective distances between the centers of the adjacent first and second electrode fingers 3 and 4 of 1.5 pairs or more of the first and second electrode fingers 3 and 4. Further, the widths of the first and second electrode fingers 3 and 4, that is, the dimensions of the first and second electrode fingers 3 and 4 in the opposing direction are preferably in the range of about 150 nm or more and about 1,000 nm or less, for example.

Further, in the present preferred embodiment, since the Z-cut piezoelectric film is used, the direction orthogonal or substantially orthogonal to the length direction of the first and second electrode fingers 3 and 4 is the direction orthogonal or substantially orthogonal to the polarization direction of the piezoelectric film 2. This does not apply when a piezoelectric material having another cut angle is used as the piezoelectric film 2. Here, "orthogonal" is not limited to the case of being strictly orthogonal, and may be substantially orthogonal (the angle between the direction orthogonal to the length direction of the first and second electrode fingers 3 and 4 and a polarization direction PZ1 is, for example, about 90°±10°).

A support 8 is laminated on the second main surface 2b side of the piezoelectric film 2 with an insulating layer 7 interposed therebetween. A support substrate is a laminate including the support 8 and the insulating layer 7. Therefore, a main surface of the insulating layer 7 on the piezoelectric film 2 side is a first main surface of the support substrate. The insulating layer 7 and the support 8 have a frame shape, and include opening portions 7a and 8a as shown in FIG. 2. As a result, a cavity portion 9 is provided. The cavity portion 9 does not interfere with the vibration of the excitation region of the piezoelectric film 2. Therefore, the support 8 is laminated on the second main surface 2b with the insulating layer 7 interposed therebetween at a position where it does not overlap with the portion where at least one pair of the first and second electrode fingers 3 and 4 are provided. The insulating layer 7 may not be provided. Therefore, the support 8 can be directly or indirectly laminated on the second main surface 2b of the piezoelectric film 2.

The insulating layer 7 is preferably made of silicon oxide, for example. However, in addition to silicon oxide, an appropriate insulating material, such as, for example, silicon oxynitride or alumina can be used. The support 8 is preferably made of Si, for example. The plane orientation on the surface of Si on the piezoelectric film 2 side may be (100) or (111). Preferably, high resistance Si having, for example, a resistivity of about 2 kΩ or more is used. However, the support 8 can also be configured by using an appropriate insulating material or semiconductor material, for example.

The plurality of first and second electrode fingers 3 and 4 and the first and second bus bars 5 and 6 are preferably made of appropriate metal or alloy such as, for example, Al or AlCu alloy. In the present preferred embodiment, the first and second electrode fingers 3 and 4 and the first and second bus bars 5 and 6 have a structure in which an Al film is laminated on a Ti film, for example. A close contact layer other than the Ti film may be used if so desired.

In the elastic wave device 1, by applying an AC voltage between the first electrode fingers 3 and the second electrode fingers 4, the vibration of the thickness slip mode described later is excited as an elastic wave. In order not to interfere with this vibration, the cavity portion 9 is provided below the piezoelectric film 2.

However, in the elastic wave device including the cavity portion, corner portions of the first and second bus bars and may be located inside the cavity portion in a plan view. In that case, the pressure is concentrated on the piezoelectric film at the corner portions, and cracks may occur. This will be described with reference to FIG. 6.

Figure 6:
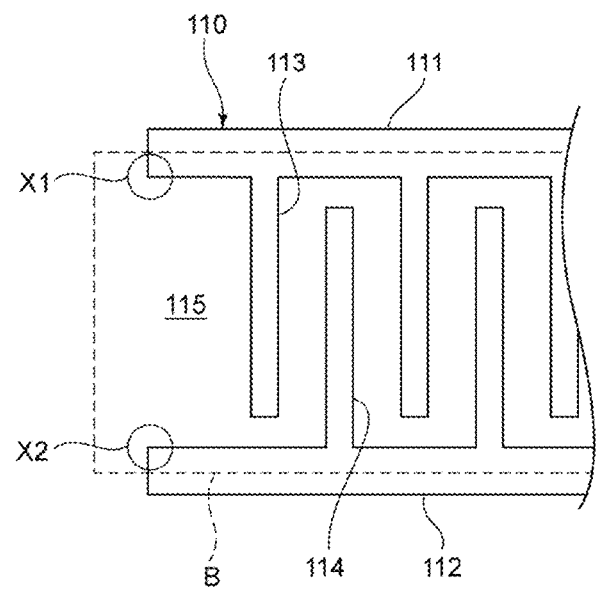
FIG. 6 is a partially cutaway plan view explaining a problem of a conventional elastic wave device.

FIG. 6 is a partially cutaway plan view explaining a problem of a conventional elastic wave device.

In an IDT electrode 110, one ends of first electrode fingers 113 and second electrode fingers 114 are connected to a first bus bar 111 and a second bus bar 112, respectively. The IDT electrode 110 is provided on a piezoelectric film 115, and a cavity portion is provided below the piezoelectric film 115. The broken line B in FIG. 6 shows the outer peripheral edge of the cavity portion when viewed in a plan view. Here, the first bus bar 111 and the second bus bar 112 include a plurality of corner portions surrounded by the circles X1 and X2 (portions where the circumscribed lines of the bus bar intersect each other at the end portion of the bus bar in a plan view). In other words, the first busbar 111 and the second busbar 112 respectively include one or more corner portions such that the first busbar 111 and the second busbar 112 collectively include a plurality of corner portions. When viewed in a plan view, these corner portions are located inside the cavity portion.

Meanwhile, the first and second bus bars 111 and 112 are physically coupled to a support substrate with the piezoelectric film 115 interposed therebetween. However, if the corner portions of the first and second bus bars 111 and 112 are provided above the cavity portion, a large pressure is applied to the piezoelectric film 115 side at the corner portions, and cracks may occur in the piezoelectric film 115.

In the elastic wave device 1 according to the first preferred embodiment, in order to prevent the cracks, at least one corner portion of the first and second bus bars 5 and 6 is located outside the cavity portion 9 when viewed in a plan view.

More specifically, the first bus bar 5 and the second bus bar 6 have a rectangular or substantially rectangular shape and have a length direction. This length direction is a direction orthogonal or substantially orthogonal to the length direction of the first and second electrode fingers 3 and 4, and is an elastic wave propagation direction.

The first bus bar 5 includes long sides 5a and 5b extending in the length direction and short sides 5c and 5d extending in the direction orthogonal or substantially orthogonal to the long sides 5a and 5b. Similarly, the second bus bar 6 includes long sides 6a and 6b and short sides 6c and 6d.

Therefore, the first bus bar 5 and the second bus bar 6 include corner portions 5e to 5h and 6e to 6h, respectively.

Here, the corner portion refers to a portion where two straight sides abut and a vicinity thereof. Specifically, the corner portions may refer to corner portions 5f, 5h, 6f, and 6h on sides of the respective first busbar 5 and second busbar 6 at which the first electrode fingers 3 and the second electrode fingers 4 are connected.

In FIG. 1B, the outer edge of the cavity portion 9 is shown by the broken line. The first and second bus bars 5 and 6 having a length direction are provided to extend to an outer region of the cavity portion 9 in the length direction. In a plan view, the corner portions 5e to 5h and 6e to 6h are both located outside the cavity portion 9.

Therefore, since the corner portions 5e to 5h and 6e to 6h, at which the stress on the piezoelectric film 2 increases, are located outside the cavity portion 9, cracks are unlikely to occur in the piezoelectric film 2.

In the elastic wave device 1, for example, in the first bus bar 5, all of the corner portions 5e to 5h are preferably located outside the cavity portion 9 when viewed in a plan view, but if only one corner portion is located outside the cavity portion 9, the stress concentration in the corner portions located outside the cavity portion 9 can be relaxed. However, it is most preferred that all of the corner portions 5e to 5h are located outside the cavity portion 9.

Further, in the elastic wave device 1, the long side 5b of the first bus bar 5 is preferably located inside the cavity portion 9, but the long side 5a is preferably located outside the cavity portion 9. Therefore, preferably, the corner portions 5f and 5h at both ends of the long side 5b located inside the cavity portion 9 are located outside the cavity portion 9. In that case, the remaining corner portions 5e and 5g are located outside the cavity portion 9.

At the time of driving the elastic wave device 1, an AC voltage is applied between the plurality of first electrode fingers 3 and the plurality of second electrode fingers 4. More specifically, an AC voltage is applied between the first bus bar 5 and the second bus bar 6. As a result, it is possible to obtain resonance characteristics using a bulk wave in the thickness slip mode excited in the piezoelectric film 2. Further, in the elastic wave device 1, when the average thickness of the piezoelectric film 2 is d, and the distance between centers of the adjacent first and second electrode fingers 3 and 4 of any of the plurality of pairs of the first and second electrode fingers 3 and 4 is p, d/p is preferably about 0.5 or less, for example. Therefore, the bulk wave in the thickness slip mode is effectively excited, and good resonance characteristics can be obtained. More preferably, d/p is about 0.24 or less, and in that case, better resonance characteristics can be obtained. In a case where the plurality of at least one of the first and second electrode fingers 3 and 4 are provided as in the present preferred embodiment, that is, when the first and second electrode fingers 3 and 4 are an electrode pair, 1.5 pairs or more of the first and second electrode fingers 3 and 4 are provided, the distance p between the centers of the adjacent first and second electrode fingers 3 and 4 refers to the average distance of the distances between the centers of the adjacent first and second electrode fingers 3 and 4.

Since the elastic wave device 1 of the present preferred embodiment has the above configuration, the Q value is unlikely to decrease even if the pair number of the first and second electrode fingers 3 and 4 is reduced in order to reduce the size. This is because the elastic wave device 1 is a resonator that does not require reflectors on both sides and has a small propagation loss. Further, the reason why the above reflectors are not required is that the bulk wave in the thickness slip mode is used. The difference between a Lamb wave used in the conventional elastic wave device and the bulk wave in the thickness slip mode will be described with reference to FIGS. 3A and 3B.

Figure 3A:
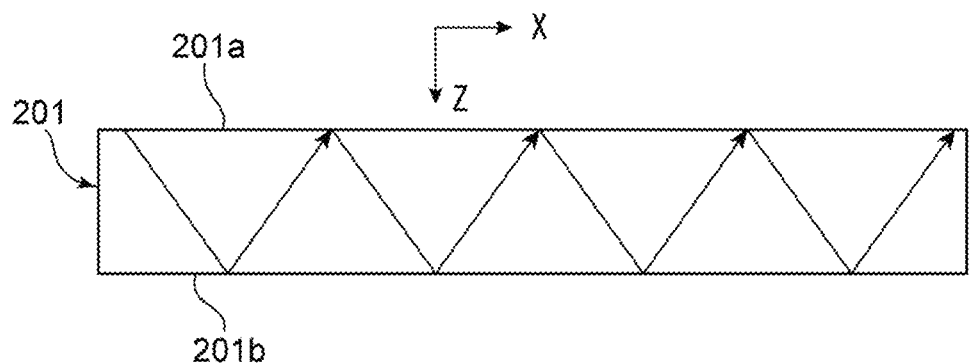
FIG. 3A is a schematic front sectional view explaining a Lamb wave propagating in a piezoelectric film of a conventional elastic wave device.

FIG. 3A is a schematic front sectional view explaining a Lamb wave propagating in a piezoelectric film of an elastic wave device as described in Japanese Patent Application Laid-Open No. 2012-257019. Here, a wave propagates in a piezoelectric film 201 as indicated by the arrows. Here, in the piezoelectric film 201, a first main surface 201a and a second main surface 201b oppose each other, and a thickness direction connecting the first main surface 201a and the second main surface 201b is the Z direction. The X direction is a direction in which electrode fingers of an IDT electrode are aligned. As shown in FIG. 3A, in the Lamb wave, the wave propagates in the X direction as shown. The wave is a plate wave. Therefore, although the piezoelectric film 201 vibrates as a whole, the wave propagates in the X direction, so that reflectors are provided on both sides to obtain resonance characteristics. Therefore, a wave propagation loss occurs, and the Q value decreases when the size is reduced, that is, when the pair number of the electrode fingers is reduced.

Figure 3B:
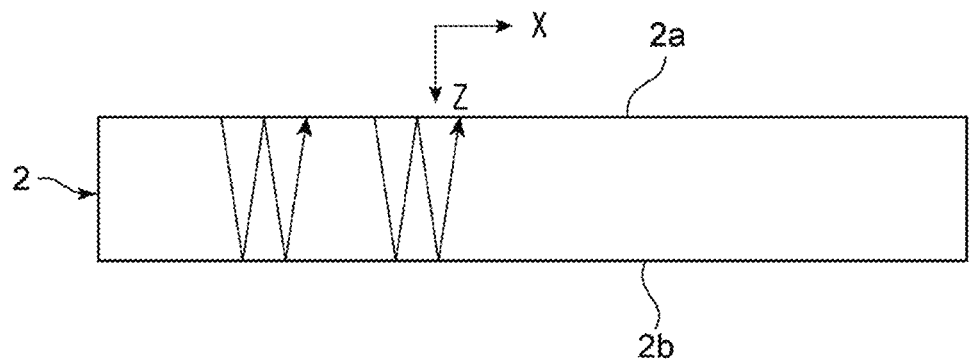
FIG. 3B is a schematic front sectional view explaining a bulk wave in a thickness slip mode propagating in a piezoelectric film in the elastic wave device according to the first preferred embodiment of the present invention.

On the other hand, as shown in FIG. 3B, in the elastic wave device of the present preferred embodiment, the vibration displacement is caused in the thickness sliding direction, so that the wave propagates in or substantially in the direction connecting the first main surfaces 2a and the second main surface 2b of the piezoelectric film 2, that is, in the Z direction and resonates. That is, the X-direction component of the wave is significantly smaller than the Z-direction component. Since the resonance characteristics are obtained by the propagation of the wave in the Z direction, the reflectors are not required. Therefore, there is no propagation loss when the wave propagates to the reflectors. Thus, even if the number of pairs of the electrode pairs including the first and second electrode fingers 3 and 4 is reduced in order to reduce the size of the elastic wave device, the Q value is unlikely to decrease.

Figure 4:
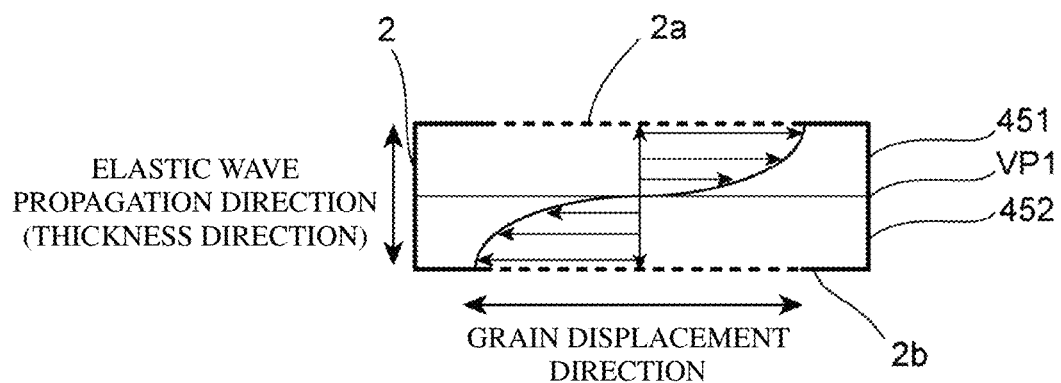
FIG. 4 is a diagram showing an amplitude direction of the bulk wave in the thickness slip mode.

As shown in FIG. 4, the amplitude direction of the bulk wave in the thickness slip mode is opposite between a first region 451 included in the excitation region of the piezoelectric film 2 and a second region 452 included in the excitation region.

In FIG. 4, the bulk wave when a voltage that causes the second electrode fingers 4 to have a higher potential than the first electrode fingers 3 is applied between the first electrode fingers 3 and the second electrode fingers 4 is schematically shown. The first region 451 is in the excitation region between a virtual plane VP1 that is orthogonal or substantially orthogonal to the thickness direction of the piezoelectric film 2 and divides the piezoelectric film 2 into two, and the first main surface 2a. The second region 452 is in the excitation region between the virtual plane VP1 and the second main surface 2b.

As described above, in the elastic wave device 1, at least one pair of electrodes including the first electrode finger 3 and the second electrode finger 4 are provided, but the wave is not propagated in the X direction. Thus, the number of pairs of the electrode pair including the first and second electrode fingers 3 and 4 does not necessarily have to be plural. That is, it is only necessary that at least one pair of electrodes is provided.

For example, the first electrode finger 3 is connected to a hot potential, and the second electrode finger 4 is connected to a ground potential. However, the first electrode finger 3 may be connected to the ground potential and the second electrode finger 4 may be connected to the hot potential. In the present preferred embodiment, at least one pair of electrodes are an electrode connected to the hot potential and an electrode connected to the ground potential as described above, and a floating electrode is not provided.

Incidentally, when the average thickness of the piezoelectric film 2 is d and the distance between the centers of the electrodes of the first electrode finger 3 and the second electrode finger 4 is p, as described above, in the present preferred embodiment, d/p is preferably about 0.5 or less, and more preferably about 0.24 or less, for example. This will be described with reference to FIG. 5.

Figure 5:
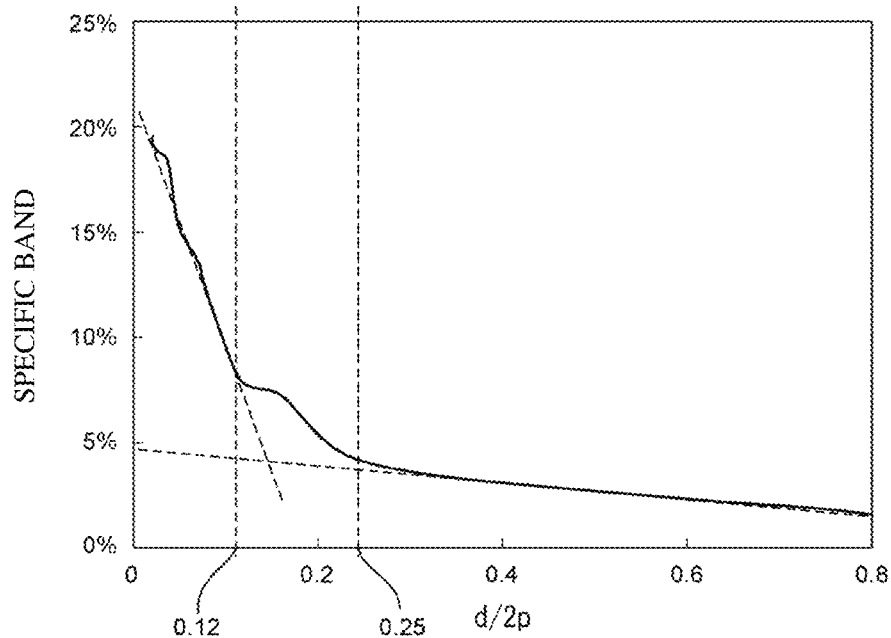
FIG. 5 is a diagram showing the relationship between d/2p and a specific band as a resonator when the distance between the centers of adjacent electrodes or an average distance of distances between the centers of the adjacent electrodes is p and the thickness of the piezoelectric film is d.

Similarly to the elastic wave device that obtained the above resonance characteristics, however, d/2p was changed, and a plurality of elastic wave devices were obtained. FIG. 5 is a diagram showing the relationship between d/2p and a specific band as a resonator of the elastic wave device.

As is shown in FIG. 5, when d/2p exceeds about 0.25, that is, when d/p>about 0.5, the specific band is less than about 5% even if d/p is adjusted. On the other hand, when d/2p≤about 0.25, that is, d/p≤about 0.5, the specific band can be set to about 5% or more by changing d/p within that range, that is, a resonator having a high coupling coefficient can be obtained. Further, when d/2p is about 0.12 or less, that is, when d/p is about 0.24 or less, the specific band can be increased to about 7% or more. In addition, if d/p is adjusted within this range, a resonator having a wider specific band can be obtained, and a resonator having a higher coupling coefficient can be obtained. Therefore, it can be seen that by setting d/p to about 0.5 or less as in the second preferred embodiment of the present invention, it is possible to construct a resonator having a high coupling coefficient using the bulk wave in the thickness slip mode.

As described above, at least one pair of electrodes may be one pair, and in the case of one pair of electrodes, p is the distance between the centers of the adjacent first and second electrode fingers 3 and 4. In the case of 1.5 pairs or more of electrodes, the average distance of the distances between the centers of the adjacent first and second electrode fingers 3 and 4 may be p.

Further, as for the average thickness d of the piezoelectric film, when the piezoelectric film 2 has a thickness variation, a value obtained by averaging the thickness may be adopted.

Second Preferred Embodiment

Figure 7A:
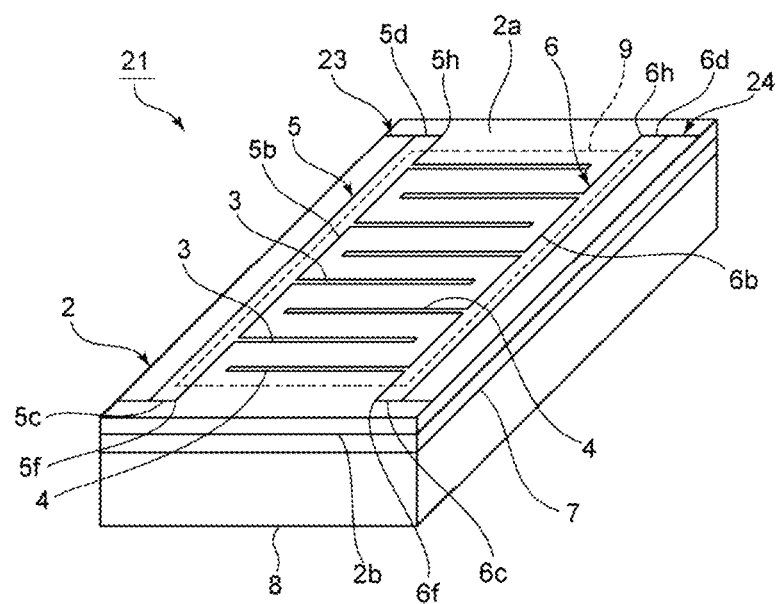
FIGS. 7A and 7B are a perspective view and a plan view explaining an elastic wave device according to a second preferred embodiment of the present invention.
Figure 7B:
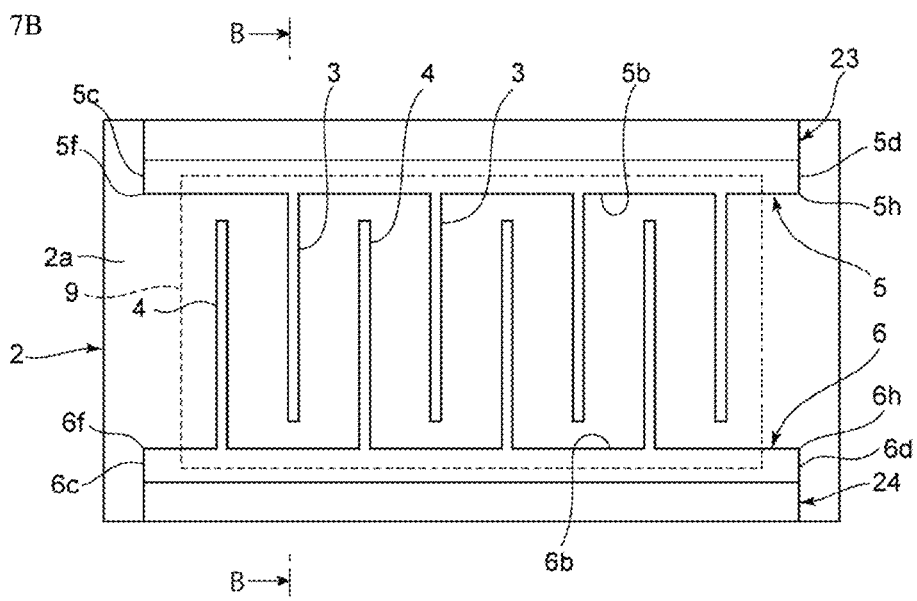
Figure 8:
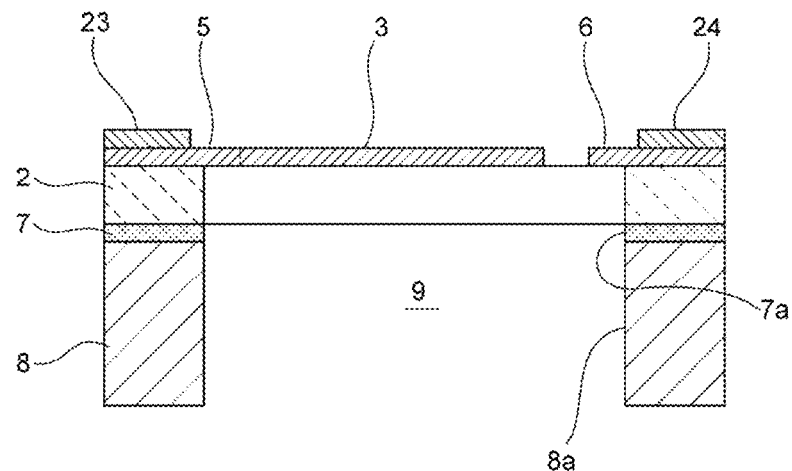
FIG. 8 is a sectional view of a portion of the elastic wave device according to the second preferred embodiment of the present invention along the line B-B in FIG. 7A.

FIGS. 7A and 7B are a perspective view and a plan view explaining an elastic wave device according to a second preferred embodiment of the present invention, and FIG. 8 is a cross sectional view of a portion along the line B-B in FIG. 7B.

In an elastic wave device 21, second-layer electrode patterns 23 and 24 are provided on the piezoelectric film 2. Further, the first bus bar 5 and the second bus bar 6 are provided so that the outer long sides extend to the outside of the second-layer electrode patterns 23 and 24. The elastic wave device 21 is configured in the same or substantially the same manner as the elastic wave device 1, except for the planar shapes of the first and second bus bars 5 and 6 and the second-layer electrode patterns 23 and 24.

It is preferable that the second-layer electrode patterns 23 and 24 are made of, for example, a metal material having higher conductivity than the first and second bus bars 5 and 6. As a result, the electric resistance can be lowered and the loss can be reduced.

In the present preferred embodiment, the second-layer electrode patterns 23 and 24 may be provided to cover a portion or an entirety of the first and second bus bars 5 and 6 in this way.

Also in this case, the corner portions of the first and second bus bars 5 and 6 are located outside the cavity portion 9 when viewed in a plan view. Therefore, also in the elastic wave device 21 according to the second preferred embodiment, cracks in the piezoelectric film 2 above the cavity portion 9 are unlikely to occur.

Third Preferred Embodiment

Figure 9:
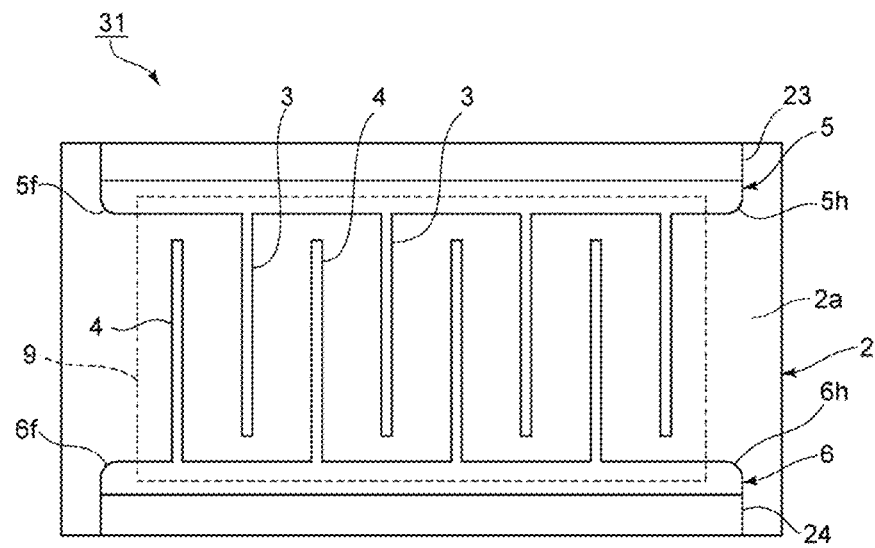
FIG. 9 is a plan view explaining an elastic wave device according to a third preferred embodiment of the present invention.

FIG. 9 is a plan view explaining an elastic wave device according to a third preferred embodiment of the present invention. In an elastic wave device 31, the corner portions 5f, 5h, 6f, and 6h are rounded in the first bus bar 5 and the second bus bar 6. That is, the corner portions 5f, 5h, 6f, and 6h are curved. Therefore, the stress concentration on the piezoelectric film 2 at the corner portions 5f, 5h, 6f, and 6h can be reduced. Therefore, cracks in the piezoelectric film 2 at the corner portions 5f, 5h, 6f, and 6h can be further reduced or prevented.

Also in the elastic wave device 31, all of the corner portions are located outside the cavity portion 9 when viewed in a plan view. Therefore, cracks in the piezoelectric film 2 can be reduced at all of the corner portions.

Fourth Preferred Embodiment

Figure 10:
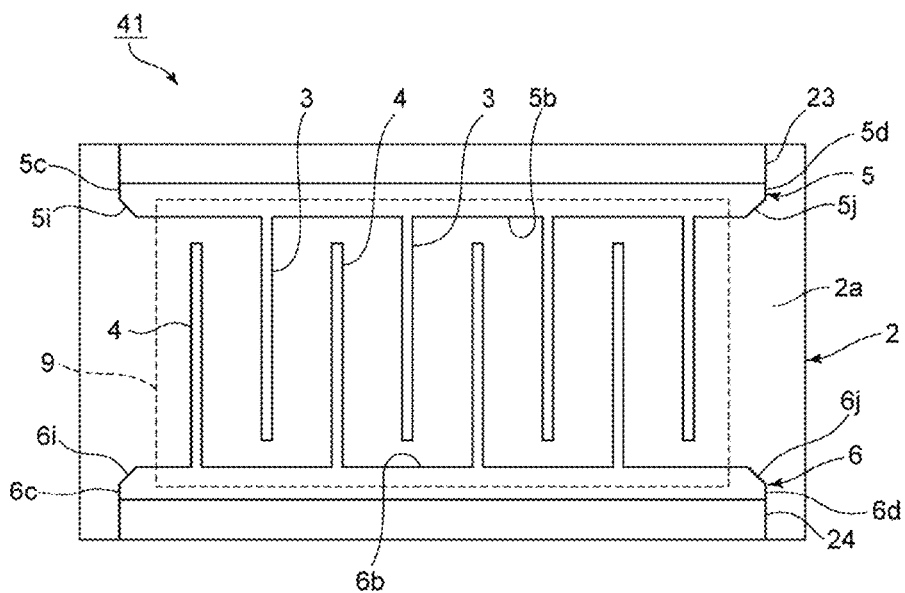
FIG. 10 is a plan view explaining an elastic wave device according to a fourth preferred embodiment of the present invention.

FIG. 10 is a plan view explaining an elastic wave device according to a fourth preferred embodiment of the present invention.

In an elastic wave device 41 according to the fourth preferred embodiment, in the corner portions of the first and second bus bars 5 and 6, corners of the short sides 5c, 5d, 6c, and 6d which abut against the long sides 5b and 6b are cut out, and the outer peripheral edges are configured as oblique sides 5i, 5j, 6i, and 6j. In this way, the stress concentration on the piezoelectric film 2 at the corner portions may be reduced by cutting out the corner portions and providing the oblique sides 5i, 5j, 6i, 6j.

Also in the elastic wave device 41, all of the corner portions are located outside the cavity portion 9 when viewed in a plan view. Therefore, as in the first to third preferred embodiments, cracks in the piezoelectric film at each corner portion are unlikely to occur.

Fifth Preferred Embodiment

Figure 11:
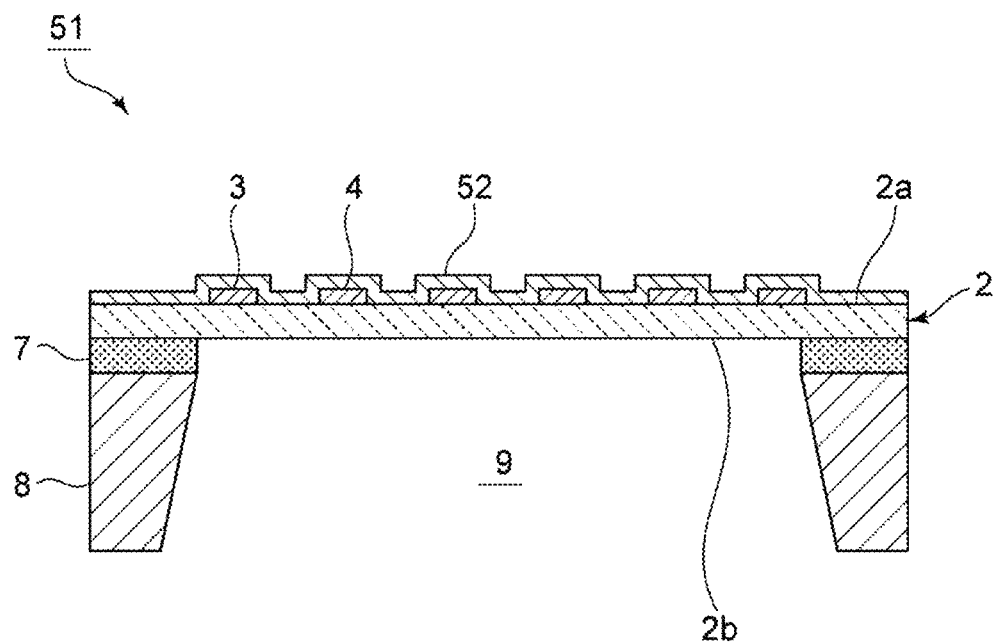
FIG. 11 is a front sectional view explaining an elastic wave device according to a fifth preferred embodiment of the present invention.

FIG. 11 is a front sectional view explaining an elastic wave device according to a fifth preferred embodiment of the present invention. In an elastic wave device 51, a protective film 52 covers the first and second electrode fingers 3 and 4. Such a protective film 52 may be provided. Thus, moisture resistance can be improved.

Further, the frequency temperature characteristic may be adjusted by using, for example, silicon oxide or the like as the protective film 52. As the material of the protective film 52 as described above, various insulators such as, for example, silicon oxide, silicon oxynitride, and silicon nitride can be used.

Sixth Preferred Embodiment

Figure 12:
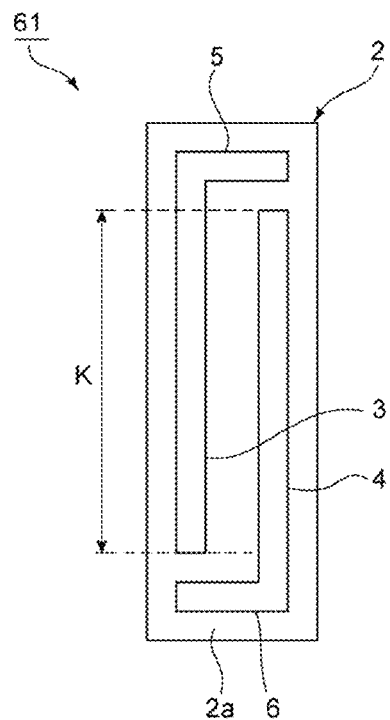
FIG. 12 is a plan view explaining an elastic wave device according to a sixth preferred embodiment of the present invention.

FIG. 12 is a plan view of an elastic wave device according to a sixth preferred embodiment of the present invention. In an elastic wave device 61, a pair of electrodes including the first electrode finger 3 and the second electrode finger 4 are provided on the first main surface 2a of the piezoelectric film 2. In addition, K in FIG. 12 is a length of the excitation region. As described above, in the elastic wave device of the present preferred embodiment, the pair number of the electrodes may be one. Even in this case, if d/p is about 0.5 or less, the bulk wave in the thickness slip mode can be effectively excited.

Seventh Preferred Embodiment

Figure 13:
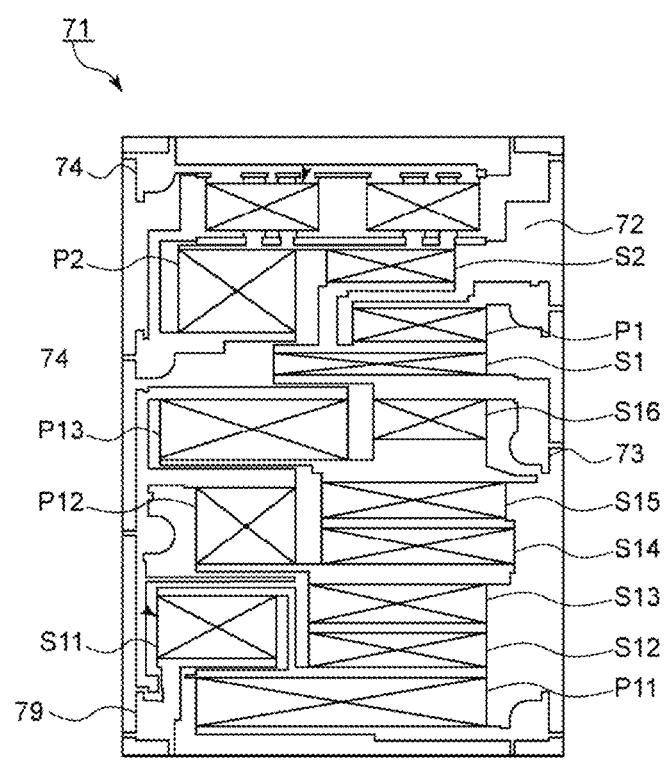
FIG. 13 is a plan view of a composite filter device including a ladder filter as a seventh preferred embodiment of the present invention.
Figure 14:
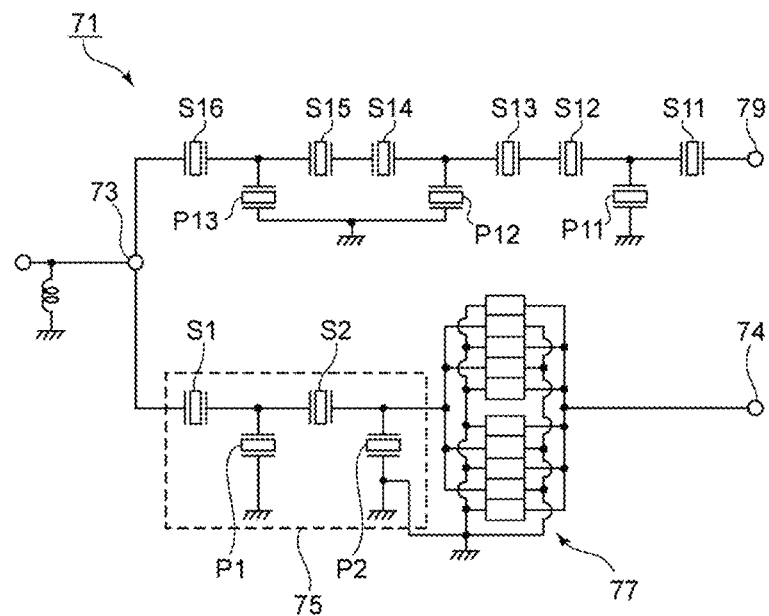
FIG. 14 is a circuit diagram of the composite filter device shown in FIG. 13.

FIG. 13 is a plan view of a composite filter device 71 including a ladder filter as a seventh preferred embodiment of the present invention, and FIG. 14 is a circuit diagram thereof.

The composite filter device 71 is preferably used in an RF stage of a smartphone or the like, for example. The composite filter device 71 includes a piezoelectric film 72. Below the piezoelectric film 72, a support substrate including a plurality of recessed portions defining or functioning as cavity portions is joined.

A common terminal 73 is provided on the piezoelectric film 72. The common terminal 73 is connected to an antenna. A ladder filter 75 and a vertically coupled resonator filter 77 are connected between the common terminal 73 and a receiving terminal 74. The ladder filter 75 includes series arm resonators S1 and S2 and parallel arm resonators P1 and P2, which are defined by elastic wave resonators. For example, the elastic wave device 1 can be used as at least one of the series arm resonators S1 and S2 and the parallel arm resonators P1 and P2 of the ladder filter 75.

Further, a transmission filter including a ladder filter is configured between the common terminal 73 and a transmission terminal 79. The transmission filter includes series arm resonators S11 to S16 and parallel arm resonators P11 to P13. Also in the ladder filter as this transmission filter, at least one of the series arm resonators S11 to S16 and the parallel arm resonators P11 to P13 can be configured by an elastic wave device configured according to the present invention, such as the elastic wave device 1. As a result, occurrence of cracks in the piezoelectric film 72 can be effectively reduced or prevented.

Further, the cracks in the piezoelectric film 72 described above are likely to occur in the outer peripheral edge of the composite filter device 71, that is, in the cavity portion near an outer peripheral edge of a composite filter device chip. Therefore, in FIG. 13, the elastic wave device of the present preferred embodiment is effectively applied to, for example, the parallel arm resonator P11, the series arm resonator S11, the parallel arm resonator P13, and the like including the cavity portion near the outer peripheral edge when the composite filter device 71 is viewed in plan view.

Eighth Preferred Embodiment

Figure 15:
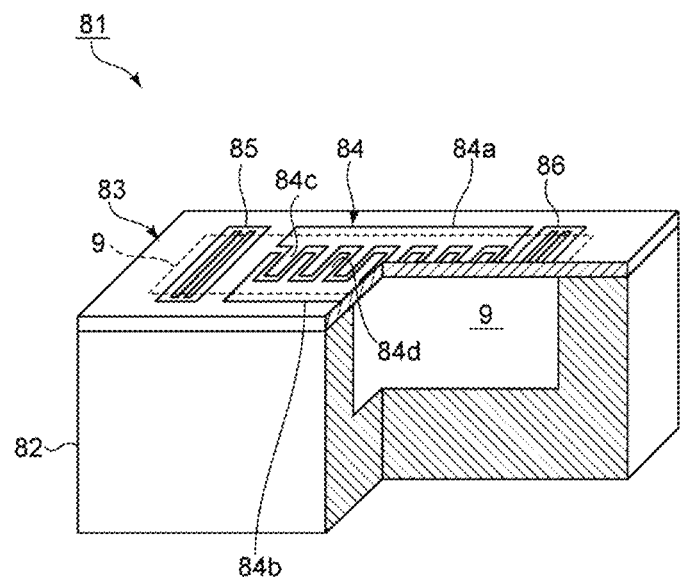
FIG. 15 is a partially cutaway perspective view explaining an elastic wave device according to an eighth preferred embodiment of the present invention.
Figure 16:
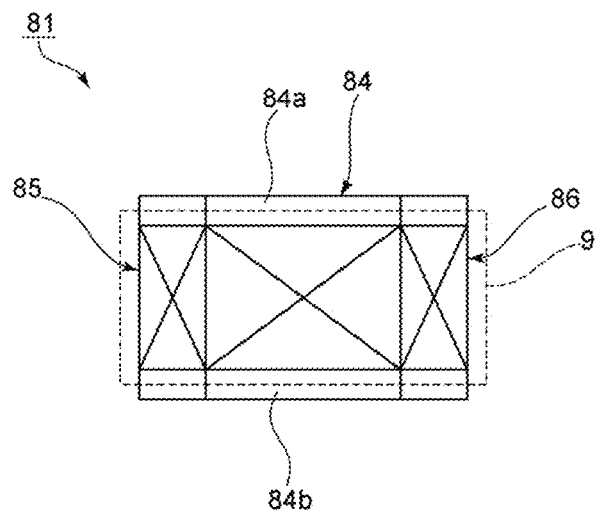
FIG. 16 is a schematic plan view of the elastic wave device according to the eighth preferred embodiment of the present invention.

FIG. 15 is a partially cutaway perspective view explaining an elastic wave device according to an eighth preferred embodiment of the present invention, and FIG. 16 is a plan view thereof.

An elastic wave device 81 includes a support substrate 82. The support substrate 82 includes a recessed portion open to the upper surface. A piezoelectric film 83 is laminated on the support substrate 82. As a result, the cavity portion 9 is provided. An IDT electrode 84 is provided on the piezoelectric film 83 above the cavity portion 9. Reflectors 85 and 86 are provided on both sides of the IDT electrode 84 in the elastic wave propagation direction. In FIGS. 15 and 16, the outer peripheral edge of the cavity portion 9 is shown by the broken line. Here, the IDT electrode 84 preferably includes first and second bus bars 84a and 84b, a plurality of first electrode fingers 84c, and a plurality of second electrode fingers 84d. The plurality of first electrode fingers 84c are connected to the first bus bar 84a. The plurality of second electrode fingers 84d are connected to the second bus bar 84b. The plurality of first electrode fingers 84c and the plurality of second electrode fingers 84d are interleaved with each other.

In the elastic wave device 81, a Lamb wave as a plate wave is excited by applying an AC electric field to the IDT electrode 84 above the cavity portion. Since the reflectors 85 and 86 are provided on both sides, the resonance characteristics due to the Lamb wave can be obtained.

Also in the elastic wave device 81, corner portions of the first bus bar 84a and the second bus bar 84b which are located on the outside in the direction orthogonal or substantially orthogonal to the elastic wave propagation direction are located outside the cavity portion 9. That is, not the reflectors 85 and 86, but the corner portions of the first and second bus bars 84a and 84b of the IDT electrode 84 are located outside the cavity portion 9. Therefore, the stress concentration on the piezoelectric film 83 at these corner portions can be reduced, and cracks can be reduced or prevented.

As described above, the elastic wave device of the present preferred embodiment may use a plate wave.

Ninth Preferred Embodiment

Figure 17:
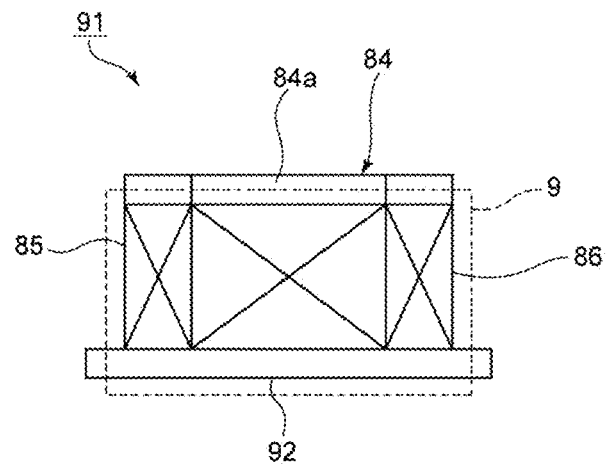
FIG. 17 is a schematic plan view explaining a main portion of an elastic wave device according to a ninth preferred embodiment of the present invention.

FIG. 17 is a schematic plan view explaining a main part of an elastic wave device 91 according to a ninth preferred embodiment of the present invention. The elastic wave device 91 corresponds to a modified example of the elastic wave device 81. Here, the first bus bar 84a on the hot side of the IDT electrode 84 is preferably configured in the same or substantially the same manner as the elastic wave device 81. However, a second bus bar on the ground potential side of the IDT electrode 84 is integrated with bus bars of the reflectors 85 and 86 to define a common bus bar. Both ends of the second bus bar 92 in the length direction extend to the outside of the cavity portion 9. Therefore, when viewed in a plan view, all four corner portions of the second bus bar 92 are located outside the cavity portion 9. Therefore, the stress concentration on the piezoelectric film 83 can be reduced at all of the corner portions of the second bus bar 92 on the ground potential side. Therefore, cracks in the piezoelectric film 83 are less likely to occur.

Tenth Preferred Embodiment

Figure 18:
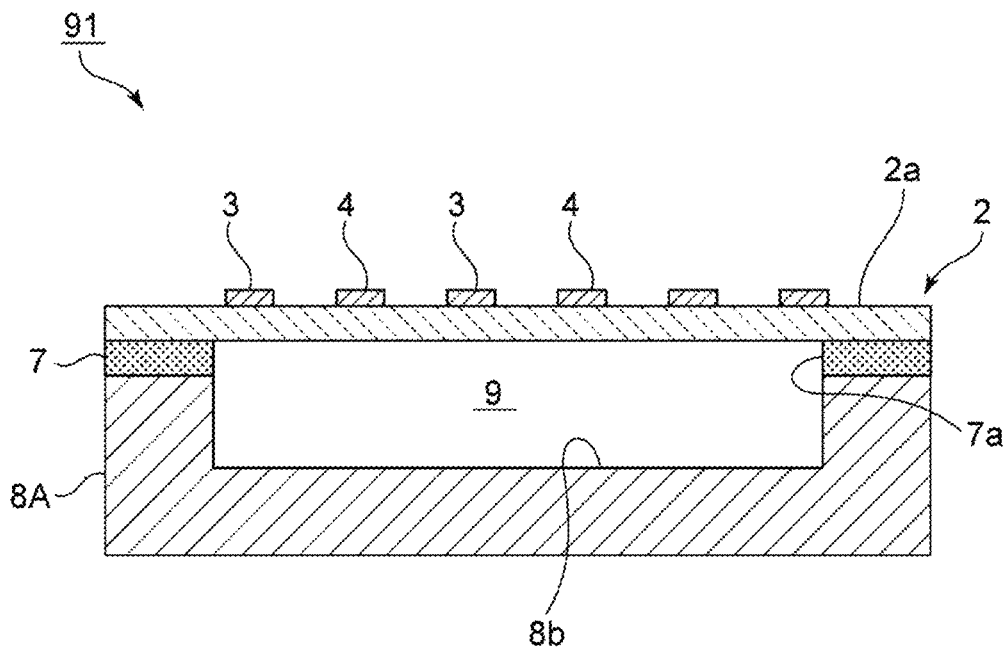
FIG. 18 is a front sectional view explaining an elastic wave device according to a tenth preferred embodiment of the present invention.

FIG. 18 is a front sectional view explaining an elastic wave device according to a tenth preferred embodiment of the present invention. In FIG. 18, a portion similar to that in FIG. 2 showing the elastic wave device 1 of the first preferred embodiment is illustrated.

In the elastic wave device 91, a support 8A includes a recessed portion 8b open to the upper surface. The recessed portion 8b is closed by the piezoelectric film 2 to define the cavity portion 9. As described above, the cavity portion 9 may have a structure including a bottom portion. In other structures, the elastic wave device 91 is configured in the same or substantially the same manner as the elastic wave device 1.

Eleventh Preferred Embodiment

Figure 19:
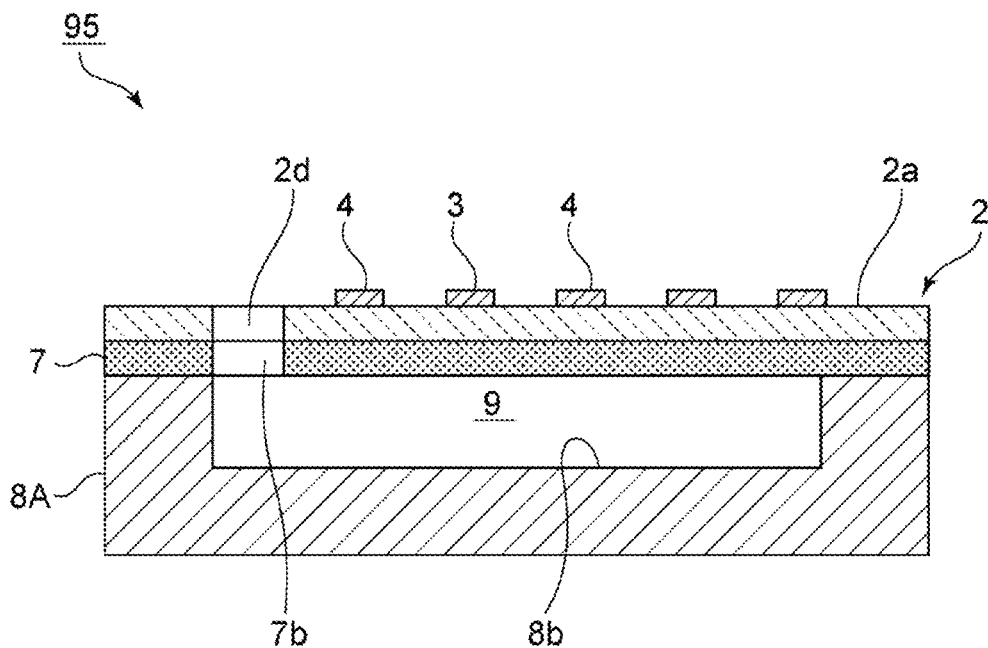
FIG. 19 is a front sectional view explaining an elastic wave device according to an eleventh preferred embodiment of the present invention.

FIG. 19 is a front sectional view explaining an elastic wave device according to an eleventh preferred embodiment of the present invention. In FIG. 19, a portion similar to that in FIG. 2 showing the elastic wave device 1 of the first preferred embodiment is illustrated.

In an elastic wave device 95, the piezoelectric film 2 and the insulator 7 include an opening 2d and an opening 7b. Thus, the cavity portion 9 is in communication with the bottom portion.

Other structures of the elastic wave device 95 are the same as or similar to those of the elastic wave device 91 shown in FIG. 18. In this way, the cavity portion 9 may be in communication with the outside with the opening 2d and the opening 7b interposed therebetween.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a support substrate including a first main surface and a recessed portion at the first main surface;
   a piezoelectric film made of lithium niobate or lithium tantalate, laminated on the first main surface of the support substrate, and defining a cavity portion with the recessed portion; and
   an electrode on the piezoelectric film and including first and second bus bars, a first electrode finger connected to the first bus bar, and a second electrode finger connected to the second bus bar; wherein
   the first and second bus bars include a plurality of corner portions when viewed in a plan view;
   the elastic wave device is configured to use a bulk wave in a thickness slip mode; and at least one of the plurality of corner portions of the first and second bus bars that is closest to the first and second electrode fingers is outside the cavity portion when viewed in the plan view; and
   an outer edge of at least one of the plurality of corner portions of the first and second bus bars is curved.

2. The elastic wave device according to claim 1, wherein the at least one of the plurality of corner portions includes corner portions on sides of the respective first busbar and second busbar at which the first electrode finger and the second electrode finger are connected.

3. The elastic wave device according to claim 2, further comprising reflectors on two sides of the electrode in an elastic wave propagation direction.

4. The elastic wave device according to claim 1, wherein all of the plurality of corner portions of the first and second bus bars are outside the cavity portion when viewed in the plan view.

5. The elastic wave device according to claim 1, further comprising:
   a second-layer electrode pattern laminated on at least a portion of the first and second bus bars; wherein
   the second-layer electrode pattern includes a plurality of corner portions, and at least one of the plurality of corner portions of the second-layer electrode pattern is outside the cavity portion when viewed in the plan view.

6. The elastic wave device according to claim 5, wherein all of the plurality of corner portions of the second-layer electrode pattern are outside the cavity portion when viewed in plan view.

7. The elastic wave device according to claim 5, wherein an outer edge of at least one of the plurality of corner portions of the second-layer electrode pattern is curved.

8. The elastic wave device according to claim 5, wherein
   the second-layer electrode pattern has a rectangular or substantially rectangular shape having a length direction;
   the length direction is a direction in which the first electrode finger and the second electrode finger oppose each other; and
   the plurality of corner portions of the second-layer electrode pattern include a corner portion outside one end side of the cavity portion in the length direction and a corner portion outside another end side of the cavity portion.

9. The elastic wave device according to claim 1, wherein
   the first and second bus bars have a rectangular or substantially rectangular shape having a length direction;
   the length direction is a direction in which the first electrode finger and the second electrode finger oppose each other; and
   the plurality of corner portions of the first and second bus bars include a corner portion outside one end side of the cavity portion in the length direction and a corner portion outside another end side of the cavity portion.

10. The elastic wave device according to claim 1, wherein
    the electrode including the first and second bus bars, the first electrode finger, and the second electrode finger is an interdigital transducer (IDT) electrode; and
    the first and second bus bars are bus bars in the IDT electrode.

11. The elastic wave device according to claim 10, wherein the elastic wave device does not include a reflector.

12. A ladder filter comprising:
    a series arm resonator and a parallel arm resonator; wherein
    at least one of the series arm resonator and the parallel arm resonator is an elastic wave device according to claim 1.

13. The elastic wave device according to claim 1, wherein the first electrode finger and the second electrode finger are spaced apart at an interval from one another.

14. The elastic wave device according to claim 1, wherein
    a plurality of the first electrode fingers and the second electrode fingers are provided; and
    a total number of the plurality of the first electrode fingers is different from a total number of the plurality of the second electrode fingers.

15. The elastic wave device according to claim 1, further comprising:
    an insulating layer interposed between the support substrate and the piezoelectric film.

16. An elastic wave device comprising:
    a support substrate including a first main surface and a recessed portion open to the first main surface;
    a piezoelectric film made of lithium niobate or lithium tantalate, laminated on the first main surface of the support substrate and defining a cavity portion with the recessed portion together with the support substrate; and
    an electrode on the piezoelectric film and including first and second bus bars, a first electrode finger connected to the first bus bar, and a second electrode finger connected to the second bus bar; wherein
    the first and second bus bars include a plurality of corner portions when viewed in a plan view;
    an outer edge of at least one of the plurality of corner portions of the first and second bus bars is curved;

when a thickness of the piezoelectric film is d and a distance between centers of the first electrode finger and second electrode finger is p, d/p is about 0.5 or less;

at least one of the plurality of corner portions of the first and second bus bars that is closest to the first and second electrode fingers is outside the cavity portion when viewed in the plan view; and a portion of at least one of the first and second busbars that includes the at least one of the plurality of corner portions that is outside the cavity portion overlaps with the cavity portion in the plan view.

17. The elastic wave device according to claim 16, wherein all of the plurality of corner portions of the first and second bus bars are outside the cavity portion when viewed in the plan view.

18. An elastic wave device comprising:
   a support substrate including a first main surface and a recessed portion at the first main surface;
   a piezoelectric film laminated on the first main surface of the support substrate and defining a cavity portion with the recessed portion; and
   an interdigital transducer (IDT) electrode on the piezoelectric film so that a portion of the IDT electrode overlaps the cavity portion; wherein
   the IDT electrode includes first and second bus bars, a plurality of first electrode fingers connected to the first bus bar, and a plurality of second electrode fingers connected to the second bus bar;
   the plurality of first electrode fingers and the plurality of second electrode fingers are interleaved with each other;
   the first and second bus bars include a plurality of corner portions when viewed in a plan view;
   a second-layer electrode pattern is laminated on at least a portion of the first and second bus bars;
   at least one of the plurality of corner portions of the first and second bus bars that is closest to the plurality of first and second electrode fingers is outside the cavity portion when viewed in the plan view;
   a portion of at least one of the first and second busbars that includes the at least one of the plurality of corner portions that is outside the cavity portion overlaps with the cavity portion in the plan view;
   the second-layer electrode pattern includes a plurality of corner portions, and at least one of the plurality of corner portions of the second-layer electrode pattern is outside the cavity portion when viewed in the plan view; and
   an outer edge of at least one of the plurality of corner portions of the second-layer electrode pattern is curved.

19. The elastic wave device according to claim 18, wherein the elastic wave device uses a plate wave.

* * * * *